United States Patent
Wang et al.

(10) Patent No.: US 12,526,931 B2
(45) Date of Patent: Jan. 13, 2026

(54) STRUCTURE OF CONTROL PANEL AND FREQUENCY CONVERTER

(71) Applicant: Zhejiang Holip Electronic Technology Co., Ltd, Haiyan (CN)

(72) Inventors: Yanyan Wang, Nordborg (DK); Tingzhong Peng, Nordborg (DK)

(73) Assignee: ZHEJIANG HOLIP ELECTRONIC TECHNOLOGY CO., LTD, Zhejiang (CN)

( * ) Notice: Subject to any disclaimer, the term of this patent is extended or adjusted under 35 U.S.C. 154(b) by 169 days.

(21) Appl. No.: 18/584,194

(22) Filed: Feb. 22, 2024

(65) Prior Publication Data

US 2024/0292548 A1   Aug. 29, 2024

(30) Foreign Application Priority Data

Feb. 24, 2023 (CN) .......................... 202320383619.X

(51) Int. Cl.
| | |
|---|---|
| *H05K 5/06* | (2006.01) |
| *H05K 5/00* | (2006.01) |
| *H05K 5/02* | (2006.01) |
| *H05K 5/03* | (2006.01) |

(52) U.S. Cl.
CPC ......... *H05K 5/0018* (2022.08); *H05K 5/0204* (2013.01); *H05K 5/03* (2013.01); *H05K 5/061* (2013.01)

(58) Field of Classification Search
None
See application file for complete search history.

(56) References Cited

U.S. PATENT DOCUMENTS

| | | | | |
|---|---|---|---|---|
| 6,486,399 | B1* | 11/2002 | Armstrong | H05K 5/0204 439/535 |
| 8,389,875 | B2* | 3/2013 | Sakakieda | H05K 5/0204 361/747 |
| 8,492,651 | B2* | 7/2013 | Schindler | H05K 5/061 439/535 |
| 10,492,317 | B1* | 11/2019 | Ho | H05K 7/023 |
| 10,700,615 | B2* | 6/2020 | Yamazawa | H05K 5/13 |
| 11,363,727 | B1* | 6/2022 | Yeom | F16M 11/041 |

(Continued)

FOREIGN PATENT DOCUMENTS

| | | |
|---|---|---|
| CN | 217206739 U | 8/2022 |
| CN | 217209289 U | 8/2022 |

*Primary Examiner* — Xanthia C Relford
(74) *Attorney, Agent, or Firm* — McCormick, Paulding & Huber PLLC

(57) ABSTRACT

A structure of the control panel is mounted on a door panel of an external device and includes a control panel. The control panel includes a front cover and a circuit board. The front cover includes an operation surface and a first sidewall extending from an edge of the operation surface in a first direction perpendicular to the operation surface. The circuit board is mounted in an accommodation space formed by the first sidewall and the operation surface. The structure includes a sealing ring, provided between the control panel and the door panel. A first sealing surface of the sealing ring abuts against a convex edge of the first side wall and a second sealing surface abuts against the door panel. When the control panel is fastened to the door panel, a gap between the control panel and the door panel is sealed.

8 Claims, 3 Drawing Sheets

(56) References Cited

U.S. PATENT DOCUMENTS

| | | | |
|---|---|---|---|
| 11,493,545 B2* | 11/2022 | Beishline | G01R 19/257 |
| 11,683,897 B2* | 6/2023 | Vinokurov | B23K 26/362 |
| | | | 428/596 |
| 12,010,804 B2* | 6/2024 | Qian | H05K 5/03 |
| 12,349,294 B2* | 7/2025 | Yeom | G06F 21/86 |
| 2004/0159457 A1* | 8/2004 | Benson | H02G 3/14 |
| | | | 174/66 |
| 2013/0175084 A1* | 7/2013 | Taylor | H05K 5/061 |
| | | | 29/592.1 |
| 2017/0155336 A1* | 6/2017 | Yamazawa | H02M 7/003 |
| 2019/0165687 A1* | 5/2019 | Yamazawa | C09J 7/22 |

* cited by examiner

STRUCTURE OF CONTROL PANEL AND FREQUENCY CONVERTER

CROSS-REFERENCE TO RELATED APPLICATION

This application claims foreign priority benefits under 35 U.S.C. § 119 from Chinese Patent Application No. 202320383619.X, filed Feb. 24, 2023, the content of which is hereby incorporated by reference in its entirety.

TECHNICAL FIELD

The present application relates to frequency converter technologies, and more specifically, to a structure of a control panel and a frequency converter.

BACKGROUND

A frequency converter is a power control device that controls a motor by changing a working power frequency of the motor, which is generally provided with a control panel having a control function. In some cases, for example, under a severe condition such as outdoors or in a rainy day, the frequency converter is placed in a cabinet, and the control panel usually needs to be mounted on a cabinet door for easy operation. Therefore, the control panel mounted on the cabinet door further needs to be sealed to meet a specific dust-proof and waterproof requirement (for example, IP55).

The control panel is usually formed by combining front and rear shells. In this way, there are six surfaces in total to be sealed: front surface, rear surface, and four side surfaces. The front surface may be sealed by using a thin film or rubber, the four side surfaces are sealed by using ultrasonic welding or a rubber sealing ring, and the rear surface is pressed against a surface of a door panel and sealed by using rubber or a gasket.

A problem existing in the foregoing structure and sealing manner of the control panel is that, the ultrasonic welding increases manufacturing costs, and an air tightness test needs to be performed to ensure welding quality and sealing reliability; and the rubber or thread increases a size of the control panel and assembly costs. In addition, the more the sealing surfaces, the worse the sealing reliability.

SUMMARY

The present application provides a structure of a control panel and a frequency converter. Various aspects of the embodiments of the present application are described below.

According to a first aspect, the structure of the control panel is provided, which is mounted on a door panel of an external device. The structure includes: a control panel, including a front cover and a circuit board, where the front cover includes an operation surface and a first side wall extending from an edge of the operation surface in a first direction perpendicular to the operation surface, and the circuit board is mounted in an accommodation space formed by the first side wall and the operation surface; and a sealing ring, provided between the control panel and the door panel, where a first sealing surface of the sealing ring abuts against a convex edge of the first side wall, a second sealing surface abuts against the door panel, and when the control panel is fastened to the door panel, a gap between the control panel and the door panel is sealed.

Optionally, the control panel further includes a rear cover, the rear cover includes a backplane and a second side wall extending from an edge of the backplane in a second direction perpendicular to the backplane; and the rear cover is detachably connected to the front cover by a first connection structure, so as to embed the rear cover in the accommodation space.

Optionally, the first connection structure includes a first clamping mechanism and a second clamping mechanism, the first clamping mechanism is formed on an inner side of the first side wall, the second clamping mechanism is formed on an outer side of the second side wall, and when the first clamping mechanism and the second clamping mechanism are snap-fitted, the rear cover is fastened in the accommodation space.

Optionally, an outer surface of the backplane is lower than the convex edge of the first side wall, or an outer surface of the backplane is on the same level as the convex edge of the first side wall.

Optionally, the control panel further includes a plurality of operation keys, first ends of the operation keys are protruded on the operation surface, so as to receive an operation performed by a user, and second ends of the operation keys are abutted on the circuit board; and a screen is provided on the circuit board, and a transparent window adapted to a contour shape of the screen is provided on the operation surface of the front cover.

Optionally, a plurality of first fasteners are provided on the control panel, and mounting holes are correspondingly provided in the door panel in a one-to-one correspondence with the plurality of first fasteners; and the structure of the control panel further includes a plurality of second fasteners, and the second fasteners pass through the mounting holes, and are detachably locked on the first fasteners, so as to fasten the control panel to the door panel.

Optionally, the first fasteners are weld nuts, and the second fasteners are screws.

According to a second aspect, a frequency converter is provided in a cabinet, where the cabinet includes a door panel, and the frequency converter includes the structure of the control panel according to the first aspect.

In an embodiment of the present application, a sealing ring is arranged between a front cover of the control panel and a door panel, so that water or dust can be prevented from entering the interior of the control panel. Compared with an existing mounting manner, the number of sealing surfaces is reduced in the structure, thereby improving sealing reliability and decreasing cost. It is more economical.

DETAILED DESCRIPTION

Figure 1:
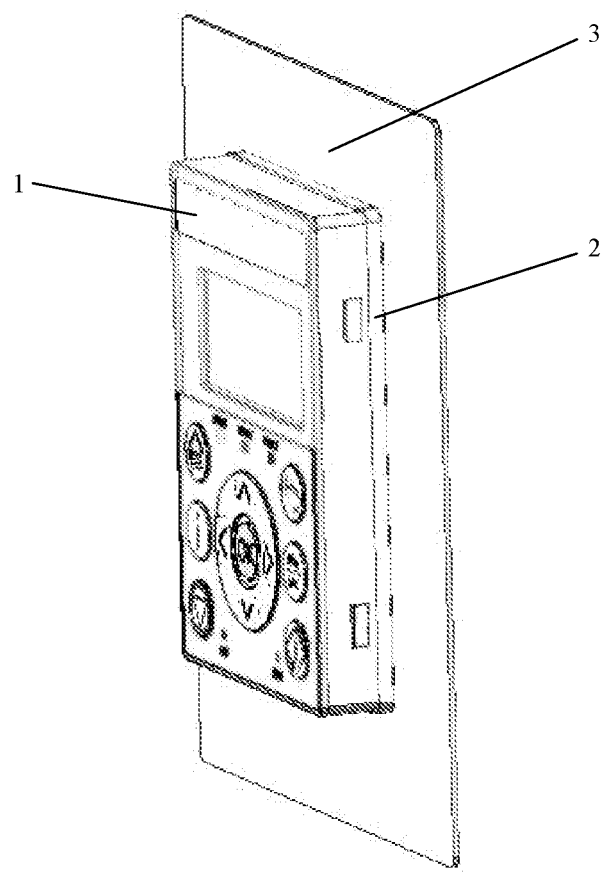
FIG. 1 is a schematic diagram of a structure of the control panel according to an embodiment of the present application.

Embodiments of the present application are described below in detail, and examples of the embodiments are shown in the accompanying drawings, where identical or similar reference numerals throughout the specification represent identical or similar elements or the elements having identical or similar functions. The embodiments described below with reference to the accompanying drawings are exemplary and intended to explain the present application, which cannot be understood as a limitation to the present application.

The embodiments of the present application provide a structure of the control panel and a frequency converter. Below, the technical solutions of the present application are further described in detail with the embodiments and with reference to the accompanying drawings. In the specification, the same or similar reference numerals indicate the same or similar components. The following descriptions of embodiments of the present application are intended to explain the overall concept of the present application with reference to the accompanying drawings, and should not be construed as a limitation to the present application.

Figure 2:
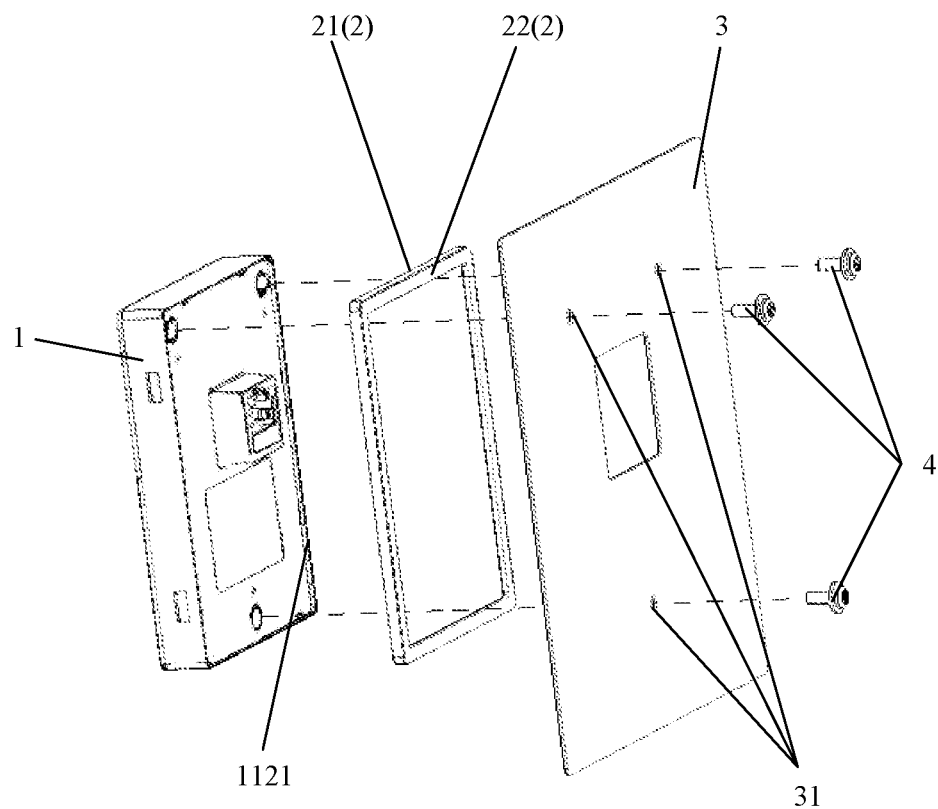
FIG. 2 is an explosion view of a structure of the control panel according to an embodiment of the present application.
Figure 3:
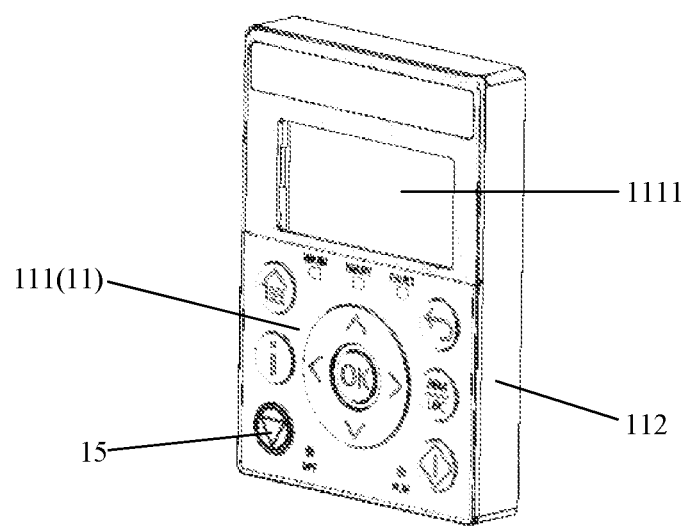
FIG. 3 is a partial view of a control panel 1 in FIG. 1.
Figure 4:
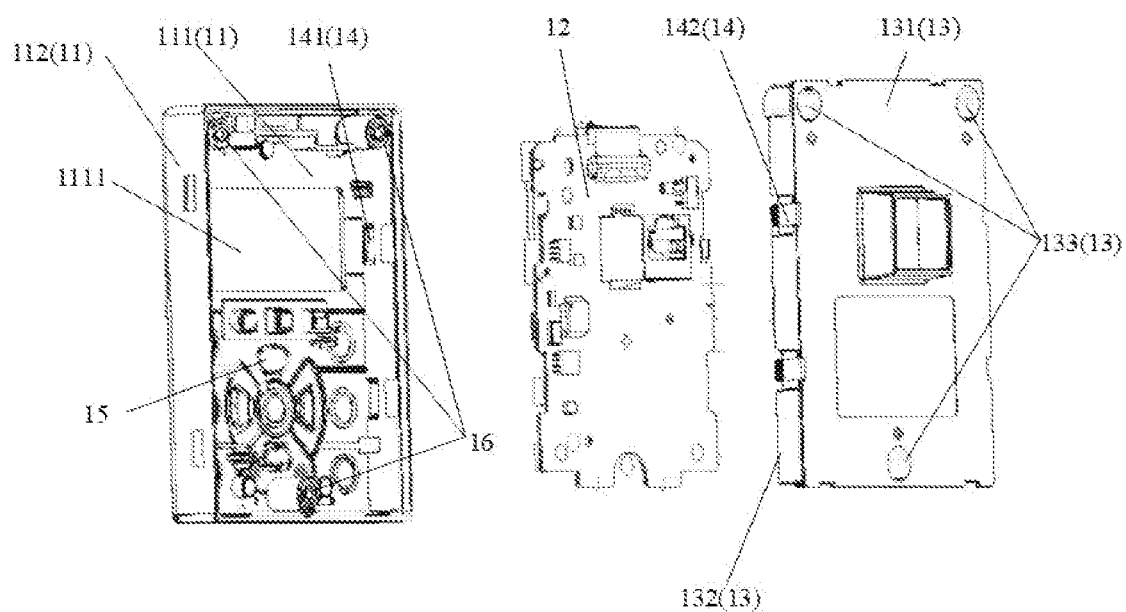
FIG. 4 is an explosion view of the control panel 1 in FIG. 1.

The structure of the control panel provided in embodiments of the present application may be mounted on a door panel of an external device, and the external device may be, for example, a frequency converter, a cabinet or a control cabinet in which the frequency converter is located. FIG. 1 shows a schematic diagram of a structure of the control panel according to an embodiment of the present application. FIG. 2 is an explosion view of FIG. 1. FIG. 3 and FIG. 4 are respectively a partial view and an explosion view of the control panel 1 in FIG. 1.

First, referring to FIG. 1 and FIG. 2, a structure of the control panel provided in an embodiment of the present application includes a control panel 1 and a sealing ring 2. The control panel 1 is fastened to a door panel 3, and the door panel 3 has a hole that is corresponding to the control panel 1. The sealing ring 2 is provided between the control panel 1 and the door panel 3, to seal a gap between the control panel 1 and the door panel 3.

A first sealing surface 21 of the sealing ring 2 abuts against a convex edge 1121 of the first side wall 112 of the control panel 1, and a second sealing surface 22 abuts against the door panel 3, to seal a gap between the control panel 1 and the door panel 3, so as to prevent water or dust from entering the gap between the control panel and the door panel, thereby achieving waterproof and dust-proof effects.

In some embodiments, the sealing ring 2 is an annular sealing ring. The sealing ring 2 may be a rubber sealing ring, for example, may be a fluorine rubber sealing ring, a nitrile rubber sealing ring, a silica gel sealing ring, an ethylene propylene rubber sealing ring, or a double fluorine rubber sealing ring. A specific material of the sealing ring is not limited in embodiments of the present application.

As shown in FIG. 3 and FIG. 4, the control panel 1 in this embodiment of the present application specifically includes a front cover 11 and a circuit board 12. The front cover 11 includes an operation surface 111 and a first side wall 112 extending from an edge of the operation surface 111 in a first direction perpendicular to the operation surface 111. The operation surface 111 and the first side wall 112 form an accommodation space, and the circuit board 12 is provided in the accommodation space. Herein, the operation surface 111 of the front cover 11 is formed integrally with the first side wall 112.

In some embodiments, the circuit board 12 may be fastened to the front cover 11 in a snap-fitted connection manner or a threaded connection manner.

The control panel in this embodiment of the present application may further include a rear cover 13, configured to abut the circuit board 12 against the front cover 11. The rear cover 13 includes a backplane 131 and a second side wall 132 extending from an edge of the backplane 131 in a second direction perpendicular to the backplane 131. Herein, the backplane 131 of the rear cover 13 is formed integrally with the second side wall 132.

The rear cover 13 may be detachably connected to the front cover 11 by a first connection structure 14, so as to embed the rear cover 13 in the accommodation space of the front cover 11.

It may be understood that the front cover 11 and the rear cover 13 may be connected by not using the first connection structure 14, but connected in another connection manner such as ultrasonic welding or glue dispensing, provided that the front cover 11 and the rear cover 13 can be connected and fastened.

It may be further understood that the first sealing surface 21 of the sealing ring 2 in the embodiment of the present application abuts against a convex edge 1121 of the first side wall 112 of the front cover 11. Therefore, when the rear cover 13 is embedded into the accommodation space of the front cover 11, an outer surface of the backplane 131 in the rear cover 13 should be lower than the convex edge 1121 of the first side wall 112. Alternatively, an outer surface of the backplate 131 may be on the same plane with the convex edge 1121 of the first sidewall 112, so as to ensure that the convex edge 1121 of the first side wall 112 is in close contact with the first sealing surface 21 of the sealing ring 2.

Referring to FIG. 4, the first connection structure 14 in the embodiment of the present application includes a first clamping mechanism 141 and a second clamping mechanism 142, where the first clamping mechanism 141 is formed in an inner side of the first side wall 112 of the front cover 11 (that is, close to a side of the accommodation space of the front cover 11), and the second clamping mechanism 142 is formed on an outer side of the second side wall 132 of the rear cover 13 (the second side wall 132 is close to one side of the first side wall 112).

In some embodiments, the first clamping mechanism 141 is a groove, and the second clamping mechanism 142 is an inverted hook type buckle. When the first clamping mechanism 141 and the second clamping mechanism 142 are mutually snap-fitted, the rear cover 13 is fastened in the accommodation space of the front cover 11.

In an implementation, the first connection structure 14 may alternatively be a threaded connection mechanism, that is, the front cover 11 and the rear cover 13 are fixed and connected by using a threaded connection workpiece such as a screw or a bolt. For example, an internal thread may be provided on an inner side of the front cover 11, a through hole is also formed in a corresponding position of the rear cover 13, and a screw passes through the through hole on the rear cover and locks with the internal thread on the inner side of the front cover 11, so as to implement connection between the front cover 11 and the rear cover 13.

Still referring to FIG. 1 to FIG. 4, the control panel 1 in the embodiment of the present application further includes a plurality of operation keys 15. First ends of the operation keys 15 are protruded on an outer surface of the operation surface 111, and second ends are abutted against the circuit board 12. A user may perform a pressing operation on a first end of an operation key, to implement control of a frequency converter. In an implementation, the operation keys 15 may further be replaced with touch keys.

In some embodiments, a screen (not shown) is further provided on the circuit board 12. Correspondingly, a transparent window 1111 adapted to a contour of the screen is provided on an operation surface 111 of the front cover 11.

In some embodiments, the transparent window 1111 and the operating surface 111 are formed integrally.

In some embodiments, a plurality of first fasteners are provided on the control panel. The first fasteners may be, for example, weld nuts 16 shown in FIG. 4. The weld nuts 16 are provided inside the accommodation space of the front cover 11. For example, in this embodiment, three weld nuts 16 are respectively located in an upper left corner, an upper right corner, and a lower center of the accommodation space. In addition, the weld nuts 16 may be mechanism nuts that are detachable and reusable.

The amount and locations of weld nuts 16 are not limited in embodiments of the present application. Three nuts shown in FIG. 4 are merely examples, and nuts may be provided based on a structure of a control panel and a layout of a circuit board. Correspondingly, a plurality of mounting holes 31 that are in a one-to-one correspondence with the plurality of weld nuts are provided on the door panel 3, and a plurality of mounting holes 133 that are in a one-to-one correspondence with the plurality of weld nuts 16 are also provided on the rear cover 13.

Referring to FIG. 2, the structure of the control panel in the present application further includes a plurality of second fasteners 4, which are screws. The second fasteners 4 pass through the mounting holes 31 on the door panel 3 and the mounting holes 133 on the rear cover 13, and are detachably locked on the first fasteners (weld nuts 16), so as to fasten the control panel 1 to the door panel 3. In addition, an axial force generated by tightening a screw can press the control panel 1 onto the door panel 3, so that a sealing ring 2 is elastically deformed to obtain better sealing effect.

In the embodiment of the present application, a sealing ring is provided between a front cover of the control panel and a door panel, so that water or dust can be prevented from entering the interior of the control panel. Compared with an existing mounting manner, the amount of sealing surfaces is reduced in the structure, thereby improving sealing reliability and decreasing sealing cost. It is more economical.

An embodiment of the present application further provides a frequency converter, which is placed in a cabinet and includes the foregoing structure of the control panel that is installed on a cabinet door. A structure of the control panel is described in detail in the foregoing embodiments, and details are not described herein again.

In the description of embodiments of the present application, it should be understood that the terms "first" and "second" are merely intended for a purpose of description, and shall not be understood as an indication or implication of relative importance or implicit indication of the number of indicated technical features. Therefore, the features defined by "first" and "second" may indicate or imply that at least one of the features is included. In the description of the embodiments of the present application, "a plurality of" means at least two, for example, two or three, unless otherwise specifically limited.

In the embodiments of the present application, unless expressly specified and defined otherwise, the terms "mounted", "join", "connect", and "fixed" should be understood in a broad sense. For example, "connection" may be a fixed connection, a detachable connection, or an integral connection; or may be a mechanical connection, an electrical connection; or may be a direct connection or an indirect connection by means of an intermediate medium; or may be an internal communication or an interactive relationship between two elements, unless expressly specified otherwise. A person of ordinary skill in the art may understand specific meanings of these terms in the present application based on specific situations.

In the embodiments of the present application, unless expressly specified and defined otherwise, the expression that a first feature is "on" or "below" a second feature may mean that the first feature is in direct contact with the second feature, or that the first feature and the second feature are in indirect contact via an intermediate medium. Moreover, the first feature is "above", "over", and "on" the second feature may include that the first feature is directly above or obliquely above the second feature, or merely indicates that the first feature is higher than the second feature in horizontal height. The first feature is "below", "under" and "beneath" the second feature may mean that the first feature is directly below or obliquely below the second feature, or simply indicates that the first feature is lower than the second feature in horizontal height.

In the descriptions of embodiments of the present application, it should be understood that the orientations or positional relationships indicated by the terms "center", "vertical", "transverse", "length", "width", "thickness", "upper", "lower", "front", "rear", "left", "right", "perpendicular", "horizontal", "top", "bottom", "inside", "outside", "clockwise", "counterclockwise", "axial", "radial", "circumferential", and the like are based on the orientations or positional relationships shown in the accompanying drawings, are merely intended to facilitate the descriptions of the present application and simplify the descriptions, are not intended to indicate or imply that the apparatuses or components mentioned in the present application must have specific orientations, or be constructed and operated for a specific orientation, and therefore shall not be construed as a limitation to the present application.

In the description of embodiments of the present application, the description with reference to the terms "an embodiment", "some embodiments", "an example", "specific example", "some examples", or the like means specific features, structures, materials or characteristics described in combination with the embodiments or examples are included in at least one embodiment or example of the present application. In the description of the embodiments of the present application, the schematic representation of the foregoing terms does not necessarily refer to a same embodiment or example. Moreover, the described specific features, structures, materials, or characteristics may be combined in any one or more embodiments or examples in an appropriate manner. In addition, different embodiments or examples described in this specification and features of different embodiments or examples may be combined and grouped by those skilled in the art in the case of no conflict.

It should be understood that, in the embodiments of the present application, "B that is corresponding to A" means that B is associated with A, and B may be determined based on A. However, it should also be understood that, determining B based on A does not mean determining B based only on A, but instead B may be determined based on A and/or other information.

It should be understood that, in this specification, the term "and/or" is merely an association relationship that describes associated objects, and represents that there may be three relationships. For example, A and/or B may represent three cases: only A exists, both A and B exist, and only B exists. In addition, the character "/" herein generally indicates an "or" relationship between the associated objects.

It should be understood that, in the embodiments of the present application, sequence numbers of the foregoing processes do not mean execution sequences. The execution sequences of the processes should be determined according to functions and internal logic of the processes and should not be construed as any limitation on the implementation processes of the embodiments of the present application.

In several embodiments provided in the present application, it should be understood that, the disclosed system, apparatus, and method may be implemented in other manners. For example, the described apparatus embodiments are merely examples. For example, the unit division is merely logical function division and may be other division in actual implementation. For example, a plurality of units or components may be combined or integrated into another system, or some features may be ignored or not performed.

The units described as separate components may be or may not be physically separated, and the components displayed as units may be or may not be physical units, that is, may be located in one place or distributed on a plurality of network units. Some or all of the units may be selected according to actual needs to achieve the objective of the solutions of the embodiments.

In addition, function units in the embodiments of the present application may be integrated into one processing unit, or each of the units may exist alone physically, or two or more units may be integrated into one unit.

The foregoing descriptions are merely specific implementations of the present application, but the protection scope of the present application is not limited thereto. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. A structure of a control panel, mounted on a door panel of an external device, comprising:
   a control panel, comprising a front cover and a circuit board, wherein the front cover comprises an operation surface and a first side wall extending from an edge of the operation surface in a first direction perpendicular to the operation surface, and the circuit board is mounted in an accommodation space formed by the first side wall and the operation surface; and
   a sealing ring, provided between the control panel and the door panel, wherein a first sealing surface of the sealing ring abuts against a convex edge of the first side wall, a second sealing surface abuts against the door panel, and when the control panel is fastened to the door panel, a gap between the control panel and the door panel is sealed.

2. The structure according to claim 1, wherein
the control panel further comprises a rear cover, the rear cover comprising a backplane and a second side wall extending from an edge of the backplane in a second direction perpendicular to the backplane; and
the rear cover is detachably connected to the front cover by a first connection structure, so as to embed the rear cover in the accommodation space.

3. The structure according to claim 2, wherein
the first connection structure comprises a first clamping mechanism and a second clamping mechanism, the first clamping mechanism is formed on an inner side of the first side wall, the second clamping mechanism is formed on an outer side of the second side wall, and when the first clamping mechanism and the second clamping mechanism are snap-fitted, the rear cover is fastened in the accommodation space.

4. The structure according to claim 2, wherein an outer surface of the backplane is lower than the convex edge of the first side wall, or an outer surface of the backplane is flush with the convex edge of the first side wall.

5. The structure according to claim 1, wherein
the control panel further comprises a plurality of operation keys, first ends of the operation keys are protruded on the operation surface, so as to receive an operation performed by a user, and second ends of the operation keys are abutted on the circuit board; and
a screen is provided on the circuit board, and a transparent window adapted to a contour shape of the screen is provided on the operation surface of the front cover.

6. The structure according to claim 1, wherein
a plurality of first fasteners are provided on the control panel, and mounting holes are correspondingly provided in the door panel in a one-to-one correspondence with the plurality of first fasteners; and
the structure further comprises a plurality of second fasteners, and the second fasteners pass through the mounting holes, and are detachably locked on the first fasteners, so as to fasten the control panel to the door panel.

7. The structure according to claim 6, wherein the first fasteners are weld nuts, and the second fasteners are screws.

8. A frequency converter, provided in a cabinet, wherein the cabinet comprises a door panel, and the frequency converter comprises the structure of the control panel according to claim 1.

* * * * *